(12) United States Patent
Lou et al.

(10) Patent No.: US 6,212,654 B1
(45) Date of Patent: Apr. 3, 2001

(54) CODED MODULATION FOR DIGITAL STORAGE IN ANALOG MEMORY DEVICES

(75) Inventors: Hui-Ling Lou, Murray Hill; Carl-Erik Wilhelm Sundberg, Chatham, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/898,441

(22) Filed: Jul. 22, 1997

(51) Int. Cl.$^7$ ........................................... G06F 11/00
(52) U.S. Cl. ............................. 714/701; 714/746
(58) Field of Search ........................... 235/454; 341/98, 341/95; 250/227.23; 375/254, 296, 295; 365/149, 45; 714/773, 701, 746

(56) References Cited

U.S. PATENT DOCUMENTS

| | | | |
|---|---|---|---|
| 4,272,831 | * 6/1981 | Ullrich | 365/45 |
| 4,661,929 | * 4/1987 | Aoki et al. | 365/149 |
| 4,922,507 | 5/1990 | Simon et al. | 375/254 |
| 5,401,958 | * 3/1995 | Berkcan | 250/227.23 |
| 5,450,363 | * 9/1995 | Christopherson et al. | 341/98 |
| 5,600,677 | 2/1997 | Citta et al. | 375/296 |
| 5,629,958 | 5/1997 | Willming | 375/295 |
| 5,638,070 | * 6/1997 | Kuwaoka | 341/95 |
| 5,761,222 | 6/1998 | Baldi | 714/773 |
| 5,777,307 | * 7/1998 | Yamazaki | 235/454 |

OTHER PUBLICATIONS

G. Ungerboeck, "Channel Coding with Multilevel/Phase Signals," IEEE Transactions on Information Theory, vol. IT–28, No. 1, pp. 55–67, Jan. 1982.

G. Ungerboeck, "Trellis–Coded Modulation with Redundant Signal Sets, Part I. Introduction," IEEE Communications Magazine, vol. 25, No. 2, pp. 4–11, Feb. 1987.

G. Ungerboeck, "Trellis–Coded Modulation with Redundant Signal Sets, Part II: State of the Art," IEEE Communications Magazine, vol. 25, No. 2, pp. 12–21, Feb. 1987.

A.J. Viterbi et al., "A Pragmatic Approach to Trellis–Coded Modulation," IEEE Communications Magazine, vol. 27, No. 7, pp. 11–19, Jul. 1989.

(List continued on next page.)

*Primary Examiner*—Albert Decady
*Assistant Examiner*—David Ton
(74) *Attorney, Agent, or Firm*—Ryan, Mason & Lewis, LLP

(57) ABSTRACT

Digital data is stored in an analog memory device using coded modulation techniques. The memory device includes a number of memory cells, each capable of storing one of a number of different levels. A given set of b information bits to be stored in the memory device is first coded in a convolutional or block coder to generate a set of coded bits which includes more than b bits. The set of coded bits is then mapped to one or more corresponding levels, and the one or more levels are each stored in a separate cell of the memory device. In a one-dimensional embodiment, the coding may involve applying a rate 1/2 convolutional code to i least significant bits, i=1, 2, . . . , and mapping the resulting b+i coded bits to one of $2^{b+i}$ distinct levels in a one-dimensional AM signal set. In embodiments of the invention which utilize multidimensional signal sets, a given set of bits is mapped to a signal in an m-dimensional signal set, with or without coding of the bits, and each of the m dimensions of the selected signal is then stored as a level in a separate cell of the analog memory device. The invention increases the storage capacity of the memory device for a given readout error probability, or alternatively improves the error probability for a given storage capacity. Readout performance may be further improved by using a multiple read-and-sum unit to generate a readout value for a given stored level based on a sum or average of several different readouts of the stored level.

44 Claims, 7 Drawing Sheets

OTHER PUBLICATIONS

J. Hagenauer, "Rate Compatible Punctured Convolutional Codes (RCPC Codes) and their Applications," IEEE Transactions on Communications, vol. 36, No. 4, pp. 389–400, Apr. 1988.

R.V. Cox et al., "Sub–band Speech Coding and Matched Convolutional Channel Coding for Mobile Radio Channels," IEEE Transactions on Acoustics, Speech and Signal Processing, vol. 39, No. 8, pp. 1717–1731, Aug. 1991.

H. Lou, "Implementing the Viterbi Algorithm: Fundamentals and real–time issues for processor designers," IEEE Signal Processing Magazine, vol. 12, No. 5, Sep. 1995.

C–E.W. Sundberg et al., "Logarithmic PCM Weighted QAM Transmission over Gaussian and Rayleigh Fading Channels," IEEE Proceedings, vol. 134, Pt. F, No. 6, pp. 557–570, Oct. 1987.

A.R. Calderbank and N. Seshadri, "Multilevel Codes for Unequal Error Protection," IEEE Transactions on Information Theory, vol. 39, No. 4, pp. 1234–1248, Jul. 1993.

L–F. Wei, "Coded Modulation with Unequal Error Protection," IEEE Transactions on Communications, vol. 41, No. 10, pp. 1439–1449, Oct. 1993.

H. Imai and S. Hirakawa, "A New Multilevel Coding Method Using Error–Correcting Codes," IEEE Transactions on Information Theory, vol. IT–23, pp. 371–377, May 1977.

* cited by examiner

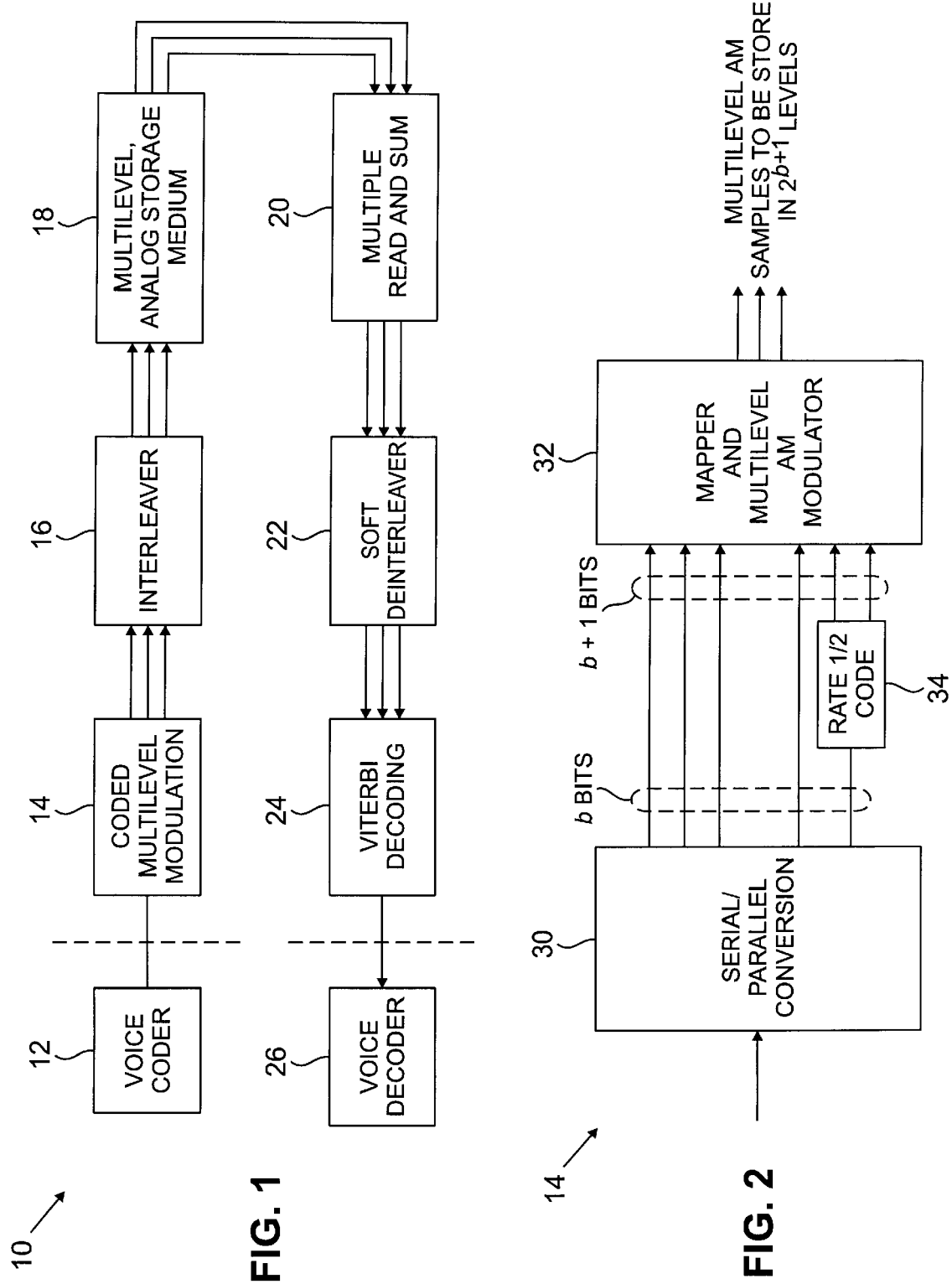

CODED MODULATION FOR DIGITAL STORAGE IN ANALOG MEMORY DEVICES

FIELD OF THE INVENTION

The present invention relates generally to analog memory devices, and more particularly to techniques which utilize coded modulation concepts to implement data storage in an analog memory device.

BACKGROUND OF THE INVENTION

An analog memory device uses a number of different amplitude levels to store more than one bit in a single memory cell. The amplitude level stored in a particular cell corresponds to one of several multi-bit binary values. Conventional analog memory cells do not utilize coding and instead generally use $2^n$ voltage levels to store n bits of information. A multi-bit binary value is stored in the cell by storing a voltage level which falls within a range corresponding to that level. For example, a three-bit binary value may be stored in a single cell by storing a particular one of eight voltage levels used to represent one of the eight possible three-bit values.

A significant problem in conventional analog memory devices is that the readout of the voltage level stored in a particular cell is generally corrupted by noise. The noise may cause a stored voltage level falling within a given voltage range to be misread as falling within another voltage range. As a result, conversion of the corrupted readout voltage to a multi-bit binary value may produce the incorrect value. The susceptibility of an analog memory cell to this type of noise-induced readout error generally depends on the size of the voltage ranges assigned to each multi-bit binary value. Since the memory cells are often constrained in practice to operate with commonly-available power supplies, the stored voltage level is typically restricted to be no larger than a certain maximum value. The need to provide an adequate voltage range for each multi-bit binary value in order to avoid noise-induced readout errors, coupled with the practical limitation on maximum cell voltage, places a severe constraint on the number of bits which can be stored in an analog memory cell, and thus on the storage capacity of a conventional analog memory device.

It is therefore apparent that a need exists for a technique which can increase the number of bits which can be stored in a given multi-bit memory cell, or alternatively provide improved readout reliability for a fixed number of stored bits per cell, without increasing the maximum stored voltage supported by the cell.

SUMMARY OF THE INVENTION

The present invention utilizes coded modulation techniques to improve data storage in an analog memory device. The memory device includes a number of analog memory cells, each capable of storing an analog signal in the form of an amplitude level. In one embodiment of the invention, a set of b information bits to be stored is first coded to generate a set of coded bits. The set of coded bits, which as a result of the coding includes more than b bits, is then mapped to one or more levels, and each of the one or more levels is stored in a corresponding one of the analog memory cells. The one or more levels to which a given set of coded bits is mapped may each correspond to a signal in a one-dimensional or multidimensional signal set. In a simple one-dimensional amplitude modulation (AM) pragmatic coding example, the coding operation may involve applying a rate 1/2 convolutional code to i least significant bits, i=1, 2, . . . , of the set of b bits such that the corresponding set of coded bits includes b+i bits. The set of b+i coded bits are then mapped to one of $2^{b+i}$ distinct amplitude levels of a one-dimensional AM signal set. The rate 1/2 code may be implemented with 64, 128 or 256 states, or another suitable number of states. Alternative embodiments of the invention may utilize other types of codes, including, for example, block codes and convolutional codes with rates other than 1/2.

In embodiments of the invention which utilize multidimensional signal sets, the mapped bits may be coded or uncoded. An example of a coded multidimensional embodiment utilizes a two-dimensional quadrature amplitude modulation (QAM) signal set or a two-dimensional AMPM signal set, and a given set of bits is mapped to a particular signal in the two-dimensional signal set. The first and second dimensions of the particular signal are then stored in respective first and second cells of the analog memory device. More generally, a given set of bits may be mapped to a signal in an m-dimensional signal set, with or without coding of the bits, and each of the m dimensions of the selected signal may then be stored as a level in a separate cell of the analog memory device. The mapping may be part of a coded modulation technique, such as trellis coded modulation, for converting a sequence of symbols, each symbol corresponding to a set of information bits, to a sequence of signals from the m-dimensional signal set. The coded modulation technique operates in accordance with predetermined conversion rules which are defined by the particular modulation technique.

An exemplary coded modulation device for use with trellis coded modulation and other coded multidimensional modulation techniques maps a sequence of b-bit symbols to a sequence of signals in an m-dimensional signal set. The first $\tilde{b}$ bits of the set of b parallel bits of a given symbol are supplied to a convolutional or block encoder which has a rate of $\tilde{b}/(\tilde{b}+1)$. A total of b+1 bits are then applied to a mapper, and the $\tilde{b}+1$ bits from the encoder are used to select a particular subset of signals in an m-dimensional signal set, while the remaining bits applied to the mapper are used to select a particular signal from the selected subset. Each of the m dimensions of the selected signal are then stored in a separate analog memory cell.

In embodiments in which readout noise is correlated across different cells of the memory device, performance may be improved by interleaving the mapped levels for different sets of coded bits prior to storing the levels in the cells of the memory device. Other embodiments of the invention may utilize combinations of two or more different types of coded or uncoded modulation to store different portions of a given block of information bits. For example, a first set of b bits may be processed using a first type of coded or uncoded modulation, and a second set of b bits processed using a second type of coded or uncoded modulation different than the first type of modulation.

In accordance with another aspect of the invention, a readout unit may be provided for reading stored levels from the memory cells. The readout unit generates a single readout value for a particular stored level using the results of multiple readouts of that stored level. For example, a particular number of multiple readouts may be summed or averaged to provide a more reliable indication of the actual level stored in a given cell. This multiple readout process is particularly useful in applications in which noise corrupting the readout from a given cell is substantially uncorrelated between successive readouts, such that the effects of the noise can in effect be averaged out over multiple readouts. The process can also provide significant signal-to-noise ratio (SNR) gain in applications in which the noise is only partially correlated between successive readouts. The multiple readout feature of the invention is suitable for use with both one-dimensional and multi-dimensional signal sets, and may be used independently of coded modulation to improve readout reliability in both coded and uncoded analog data storage applications.

The present invention provides improved storage in analog memory devices, resulting in higher storage capacity for a given bit error probability or alternatively more reliable storage in terms of bit error rate probability for a given fixed storage capacity. The improvement is achieved in the illustrative embodiments by using an increased number of storage levels in each cell and applying a combination of coding and modulation to information bits to be stored in the cells. For example, increasing the number of storage levels by one and applying a rate 1/2 convolutional code to the least significant bit of a set of uncoded bits can provide a substantial improvement in bit error rate probability for a given storage capacity. By increasing the number of levels by four and using a rate 1/2 convolutional code on the two least significant bits of a set of uncoded bits, storage capacity can be increased by one bit per cell for a given bit error probability at high SNR values. These and other features and advantages of the present invention will become more apparent from the accompanying drawings and the following detailed description.

BRIEF DESCRIPTION OF THE DRAWINGS

FIG. 1 is a block diagram of an exemplary voice data processing system which utilizes coded modulation in accordance with the invention to improve analog data storage.

FIG. 2 illustrates an exemplary embodiment of a coded multilevel modulator suitable for use in the processing system of FIG. 1.

FIG. 3A corresponds to a conventional uncoded implementation, while FIGS. 3B and 3C correspond to coded implementations in accordance with the invention using 16 levels and 32 levels, respectively.

DETAILED DESCRIPTION OF THE INVENTION

Figures 3A, 3B, 3C:
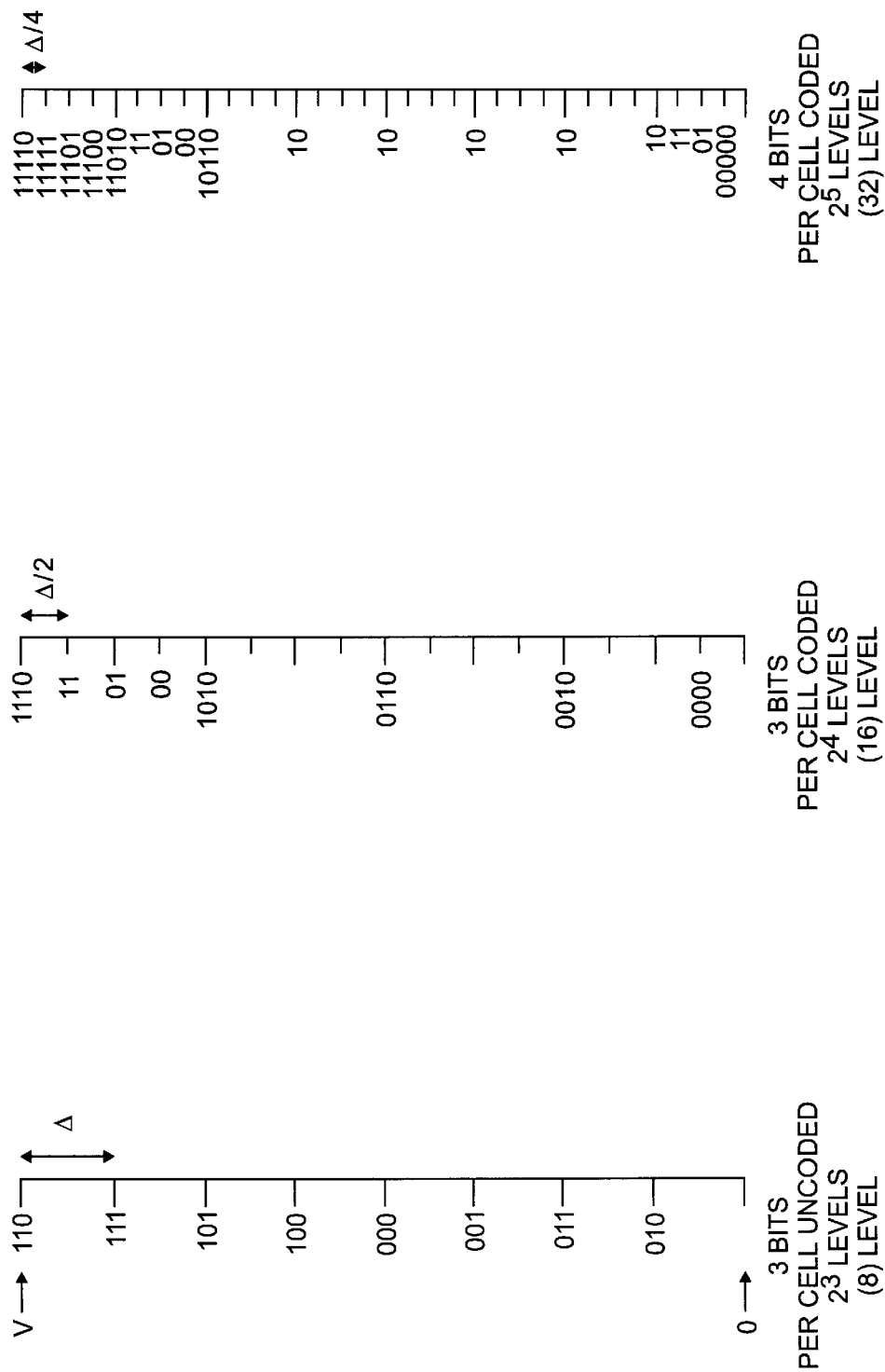
FIGS. 3A, 3B and 3C illustrate three exemplary mappers for use in an analog memory cell.

The present invention will be illustrated below in conjunction with analog memory cells using exemplary coded modulation techniques to improve storage capacity and readout performance. It should be understood, however, that the invention is suitable for use with numerous other analog memory cell applications and with a wide variety of other types of coded modulation. The term "analog memory cell" as used herein refers generally to a memory cell which uses a number of different ranges of voltage, current or any other measurable quantity to store more than a single bit of information. Analog memory cells for purposes of the present description are intended to include devices commonly known as "multilevel memory cells" in which the device readout is fully quantized and converted to a stream of bits, as well as devices in which the readout is unquantized or partially quantized and therefore provided in the form of an analog level. Although the theoretical analyses presented herein assume an unquantized readout, it will be apparent to those skilled in the art that the invention is readily applicable to devices in which the readout is fully or partially quantized. The term "coded modulation" refers to any combination of coding and modulation techniques which may be used to alter information bits prior to storage in an analog memory such that the bits may be read out from the analog memory with improved reliability. The terms "mapper" and "mapping" as used herein are intended to include coded mapping for one-dimensional signal sets, and both coded and uncoded mapping for multidimensional signal sets. In coded multidimensional applications, the mapping is part of a coded modulation process which maps a sequence of symbols to a sequence of multidimensional signals in accordance with predetermined conversion rules. The mapper may therefore be implemented as a distinct device, with or without an external encoder, or incorporated with the encoder into a coded multilevel modulation device.

The present invention utilizes coded modulation techniques to improve the storage capacity of an analog memory device, or alternatively to improve readout performance and reliability for a given fixed storage capacity. As noted above, coded modulation techniques are commonly used to improve the bandwidth efficiency and signal-to-noise performance of band-limited communication systems. Coded modulation techniques are thus well-known in the field of communication systems, and are described in greater detail in, for example, G. Ungerboeck, "Channel Coding with Multilevel/Phase Signals," IEEE Transactions on Information Theory, Vol. IT-28, No. 1, pp. 55–67, January 1982; G. Ungerboeck, "Trellis-Coded Modulation with Redundant Signal Sets, Part I. Introduction," IEEE Communications Magazine, Vol. 25, No. 2, pp. 4–11, February 1987; G. Ungerboeck, "Trellis-Coded Modulation with Redundant Signal Sets, Part II: State of the Art," IEEE Communications Magazine, Vol. 25, No. 2, pp. 12–21, February 1987; A. J. Viterbi et al., "A Pragmatic Approach to Trellis-Coded Modulation," IEEE Communications Magazine, Vol. 27, No. 7, pp. 11–19, July 1989; E. Biglieri et al., "Introduction to Trellis-Coded Modulation with Applications," Macmillan, 1991; and G. C. Clark, Jr. and J. B. Cain, "Error Correcting Codes for Digital Communications," Plenum Press, 1981, all of which are incorporated by reference herein. However, coded modulation techniques have not heretofore been applied to improving the operation of analog memory devices.

FIG. 1 is a block diagram of an exemplary processing system 10 which includes analog storage based on coded modulation in accordance with the invention. The system 10 includes a voice coder 12 for generating an input bit stream. Although this embodiment uses a bit stream generated from voice data, the invention is more generally applicable to bits generated by any type of digital source. The bit stream from voice coder 12 is supplied to a coded multilevel modulation device 14 which converts the bit stream to a stream of coded multilevel symbols. The operation of the coded modulation device 14 will be described in greater detail in conjunction with FIGS. 2 and 4 below for exemplary one-dimensional and multi-dimensional coded modulation techniques, respectively. It will be assumed that a given voltage to be stored in a memory cell falls within the positive interval from 0 volts to V volts, although it will be apparent to those skilled in the art that the described techniques can also be utilized with an interval of both positive and negative voltages, such as an interval from −V volts to V volts. As will be described in detail below, a small positive offset may be added to the 0 volt value in order to simplify the analysis. It will also be shown that the use of such an offset generally does not adversely impact performance.

The multilevel symbols output from the coded multilevel modulation device 14 are applied to an interleaver 16, and are then stored in an analog storage medium 18. The analog storage medium may be implemented as, for example, an electronic memory such as a dynamic random access memory (DRAM) memory chip or a static RAM (SRAM) chip, a magnetic memory such as a magnetic disk or tape, or an optical memory such as a compact disk (CD) or digital video disk (DVD). The invention is thus applicable to any type of memory device which is capable of storing information bits as multiple levels using an analog technique. The multilevel symbols are read out from the medium 18 using a multiple read-and-sum unit 20. The multiple read-and-sum unit averages multiple reads of a given memory cell in order to provide improved reliability in the presence of AWGN- (Additive White Gaussian Noise)like noise. The output symbols from the multiple read-and-sum unit are then supplied to a soft deinterleaver 22 followed by a soft Viterbi decoder (24). The recovered output information bit stream is then fed to a voice decoder 26, which reconstructs the original voice signal.

The interleaver 16 and deinterleaver 22 operate in a conventional manner, as described in greater detail in G. C. Clark, Jr. and J. B. Cain, "Error Correcting Codes for Digital Communications," Plenum Press, 1981, and are best suited for use in embodiments in which memory cells exhibit correlation between symbols. These elements could be eliminated in alternative embodiments. It should be noted that the interleaver may introduce additional delay concerns, as in a communication system application. In the remaining description, it is assumed that the memory cells exhibit no correlation between symbols, and that there is no interleaving. The elements 14 through 24 of system 10 may represent portions of a single integrated circuit. Alternatively, the analog storage medium 18 may be implemented in an integrated circuit which is separate from an integrated circuit incorporating one or more of the other elements of system 10. The system 10 or the elements thereof may also be implemented as portions of a desktop or portable personal computer, a microcomputer, a workstation, a mainframe computer or any other type of digital data processor. Various aspects of the invention may thus be implemented in the form of one or more software programs executed by a central processing unit (CPU) or other microprocessor in the digital data processor.

The multiple read-and-sum unit 20 itself provides performance advantages over conventional analog memory systems, apart from the advantages provided by the use of coded modulation. As noted above, the multiple read-and-sum unit averages multiple readouts from a given analog memory cell. In many applications, the noise components of the multiple readouts are substantially independent and therefore averaging the multiple readouts leads to a reduction in noise and improved readout reliability. The amount of signal-to-noise ratio (SNR) gain provided by the multiple read-and-sum unit is a function of the degree of correlation between successive readouts. It should be noted that if the noise components in successive readouts are partially or even strongly correlated, the multiple read-and-sum unit can still provide a significant amount of gain. Only in a situation in which there is complete correlation between noise components in successive readouts will the multiple readout technique produce no SNR gain. The amount of noise reduction achieved in a given application is also dependent on the specific manner in which the unit 20 is implemented. If it is assumed that the readouts are corrupted by AWGN, which is independent from readout to readout, it can be shown that a considerable SNR gain is achieved both for an otherwise conventional uncoded system and a system using the coded modulation techniques of the invention. TABLE 1 below shows the SNR gain in dB which is achieved on a curve of error probability vs. SNR for cases in which the readouts are corrupted by AWGN and the number r of repeat readouts is 2, 3, 4 and 10. In practice, the required access time of the storage medium may be a significant limitation on the number of repeat readouts which can be accommodated in a given system. The multiple readout process can be used for coded and uncoded one-dimensional signals as well as the coded and uncoded multidimensional signals to be described in more detail below. It should again be emphasized that this multiple readout feature of the invention can be incorporated into an analog memory system with or without the use of the coded modulation techniques of the invention.

TABLE 1

| SNR Gains From Multiple Readout | |
| --- | --- |
| r | Gain in dB |
| 2 | 3 |
| 3 | 4.7 |
| 4 | 6 |
| 10 | 10 |

FIG. 2 illustrates the coded multilevel modulation device 14 of FIG. 1 for an embodiment of the invention utilizing so-called "pragmatic" coding for one-sided and one-dimensional pulse amplitude modulation (PAM). Pragmatic coding is just one example of a one-dimenisional coded signal set suitable for use with the present invention. The use of pragmatic coding in communication system applications is described in greater detail in A. J. Viterbi et al., "A Pragmatic Approach to Trellis-Coded Modulation," IEEE Communications Magazine, Vol. 27, No. 7, pp. 11–19, July 1989. The coded multilevel modulation device 14 of FIG. 2 includes a serial-to-parallel converter 30, a mapper and multilevel AM modulator 32, and a rate 1/2 coder 34. The serial-to-parallel converter converts a set of b bits of the input bit stream into a set of b parallel bits. The least significant bit (LSB) of the b bits from the converter 30 is applied to an input of the rate 1/2 coder 34. The b−1 most significant bits (MSBs) from converter 30 are applied directly to corresponding inputs of the mapper/modulator 32, and are also referred to as parallel transitions. The rate 1/2 coder 34 generates two output bits for each bit applied to its input, such that a total of b+1 bits are applied to the input of the mapper/modulator 32. The mapper/modulator 32 generates a stream of coded AM symbols which are stored in analog memory cells of the storage medium 18 using $2^{b+1}$ voltage levels.

FIG. 3A illustrates a conventional uncoded mapping technique, in which b bits are mapped directly to $2^b$ levels for storage in an analog memory cell. In this example, b is three, such that $2^b$ or eight levels are used to store three bits in a given memory cell. The value $\Delta$ represents the Euclidean distance between adjacent stored levels in the uncoded case.

FIGS. 3B and 3C show examples of one-dimensional coded modulation mapping techniques in accordance with the invention, using 16 levels and 32 levels, respectively. FIGS. 3A–3C each utilize a fixed maximum voltage V. It should be noted that the lowest amplitude level changes somewhat between the different mapping techniques of FIGS. 3A–3C, which slightly affects the average energy per symbol. This is due to the fact that in this example the maximum voltage V remains fixed in each case while the number of levels changes. In alternative embodiments, the lowest amplitude level may be fixed at 0 volts, or at a small positive offset $\epsilon$. FIGS. 3A–3C each implement Gray coding of the two LSBs, as described in the above-cited Viterbi et al. reference, while the remaining bits in this example utilize a natural binary code. Thus for the coded cases of FIGS. 3B and 3C, the coded bits utilize a Gray code and the uncoded bits, which are applied directly to the mapper/modulator as parallel transitions, follow a natural binary code. Adjacent levels in FIGS. 3B and 3C are separated by Euclidean distances of $\Delta/2$ and $\Delta/4$, respectively.

Figure 4:
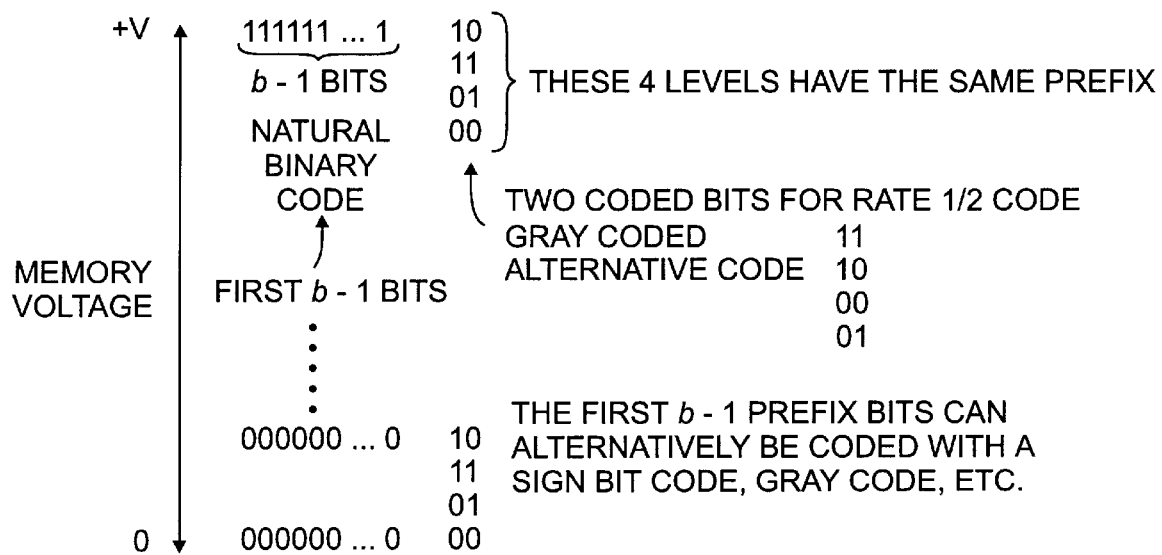
FIG. 4 illustrates an exemplary general mapper for use with one-sided one-dimensional pulse amplitude modulation (PAM), also known as "pragmatic" coded modulation.

FIG. 4 illustrates the general case of the mapper of FIGS. 3B and 3C, in which b information bits are encoded and mapped to $2^{b+1}$ levels in accordance with the above-described pragmatic coded modulation scheme. It can be seen from FIG. 4 that the LSB of the set of b bits is encoded using a rate 1/2 code such as a Gray code. The remaining b–1 bits, also referred to herein as prefix bits, are in the form of a natural binary code, but could alternatively be coded with a sign bit code, a Gray code, or another suitable code.

A theoretical analysis of the above-described coded analog storage techniques will now be provided. The analysis models a given analog memory cell as a channel corrupted by additive white Gaussian noise (AWGN). The analysis will therefore concentrate on AWGN-like effects such as thermal noise and shot noise in the memory cells. Other noise components, such as coupling noise, are often heavily dependent on the particular implementation of the memory cell, and are therefore not considered in the general model. The analysis also assumes that the output of the memory cell is available as an unquantized analog value. As previously noted, the invention may be used in applications in which the cell output is fully or partially quantized, although the use of quantization will generally produce a slight performance degradation relative to the unquantized case. It is well known that the error rate performance of coded and uncoded communication systems in an AWGN channel at a high SNR is given by the free Euclidean distance, as described in, for example, E. Biglieri et al., "Introduction to Trellis-Coded Modulation with Applications," Macmillan, 1991, and G. C. Clark, Jr. and J. B. Cain, "Error Correcting Codes for Digital Communications," Plenum Press, 1981. The SNR is defined as the ratio between the average signal power $E_s$ and the average noise power $\sigma^2$. The examples of FIGS. 3A, 3B and 3C will first be compared in a more general context. It will be assumed that the comparison is carried out using an equal peak power for all cases, as is consistent with the examples of FIGS. 3A, 3B and 3C. This has been found to be an appropriate model in the case of an analog memory device.

The three general cases are summarized as follows:

A. b information bits/cell, uncoded, $2^b$ levels

B. b information bits/cell, coded, $2^{b+1}$ levels

C. b+1 information bits/cell, coded, $2^{b+2}$ levels

Cases A, B, C are shown as special cases in FIGS. 3A, 3B and 3C, respectively. The average signal energy $E_s$ for the three general cases can be expressed as:

$$E_s = d^2 \frac{(M+1)(2M+1)}{6} \tag{1}$$

where d is the Euclidean distance between two adjacent levels, and M is the number of levels. For Cases A, B and C above, the distance d is $\Delta$, $\Delta/2$ and $\Delta/4$, respectively, and the number of levels M is $2^b$, $2^{b+1}$ and $2^{b+2}$, respectively. The peak energy $E_p$ has been determined to be a relevant measure for comparing different analog memory systems. In the systems of Cases A, B and C, with the initial level offset described in conjunction with FIGS. 3A, 3B and 3C above, the peak energy $E_p$ is given by:

$$E_p = d^2 \cdot M^2. \tag{2}$$

The normalized squared Euclidean distance (NSED) for the three cases is:

A.    $NSED = \Delta^2$

B.    $NSED = 4\Delta^2$ parallel transitions $\geq$ $\qquad 2\Delta^2 + (d_f - 4) \cdot (\Delta/2)^2$ $\qquad = \Delta^2[2 + (d_f - 4) \cdot (1/4)]$ coded bits C.    $NSED = \Delta^2$ parallel transitions $\geq$ $\qquad 2 \cdot (\Delta/2)^2 + (d_f - 4) \cdot (\Delta/4)^2$ $\qquad = \Delta^2[1/2 + (d_f - 4) \cdot (1/16)]$ coded bits Cases A, B, C have the same peak energy $E_p$. It should be noted that the above NSED analysis involves a slight approximation in terms of average power, but it will be shown below that the effects of this approximation become negligible for large b. The NSED analysis indicates that the minimum NSED for Case B is equal to four times the NSED for the uncoded Case A for binary codes with a free distance $d_f$ of at least 12, where $d_f$ is measured using the standard Hamming metric. This corresponds to an asymptotic gain in SNR of 6 dB. For Case C, the minimum NSED equals that of the uncoded Case A for binary codes with a free distance $d_f$ of at least 12. The asymptotic error probability of Cases A and C are thus the same for very high SNR values while the storage capacity of Case C exceeds that of Cases A and B by one bit per cell. For Case B, the storage capacity is the same as Case A, but the reliability in terms of readout error probability is considerably better. More particularly, Case B exhibits an improvement in SNR of 6 dB relative to Case A for high SNR values.

The above-described offset from the zero voltage level was selected to simplify the illustrative examples by yielding a factor of two in terms of distance difference, corresponding to a doubling of the number of levels, at a constant peak energy. It should be noted that although this type of offset may not be optimal in terms of the Euclidean distance at certain values of M, the effect of the approximation becomes negligible for large values of M. If the lowest voltage level is instead fixed at zero volts, while maintaining the factor of two change in distance when doubling the number of levels, the resulting system is slightly more power efficient, but the peak energy level grows with M and in the limit for large M reaches the same value as in the offset case. For this zero offset case, the average and peak energy values are as follows:

$$E_s = d^2 \frac{(M-1)(2M-1)}{6} \quad (3)$$

and $$E_p = d^2(m-1)^2. \quad (4)$$

The significance of the initial offset and the use of equal peak power rather than equal average power for comparisons will be described in greater detail below.

The average uncoded bit error probability $P_e$ for Case A, at high SNR values, may be expressed as:

$$P_e = \frac{2(M-1)}{M} Q\left(\frac{d}{2\sigma}\right) \quad (5)$$

where d and M are as given above, and Q(x) is the complimentary distribution function of a standard Gaussian variable with zero mean and a variance $\sigma^2$ of 1. For example, in Case A, $M=2^n$ and $d=\Delta$. It can be seen from Equations (1) and (5) above that if the distance between the levels is decreased by a factor of 2, i.e. to $d=\Delta/2$ in Case B, the SNR will have to be increased by a factor of factor of 4, or 6 dB, in order to achieve the same bit error probability as Case A where $d=\Delta$. This result has been verified by simulations which will be described in detail below.

The impact of the above-noted initial level offset and peak energy assumptions will now be described in greater detail. As noted previously, these assumptions were introduced for purposes of illustration and are not requirements of the present invention. The loss in Euclidean distance attributable to the initial level offset is given by:

$$E_p = d_1^2 M^2 = d_2^2 (M-1)^2 \quad (6)$$

where $d_1^2$ is the squared Euclidean distance for the system with an initial offset and $d_2^2$ is the squared Euclidean distance for a system without the offset at the same peak energy. The relative distance reduction is:

$$\frac{d_2^2}{d_1^2} = \frac{(M-1)^2}{M^2} = (1 - 2^{-b})^2 \quad (7)$$

where $M=2^b$ is the number of levels. The relative loss in channel SNR is given directly by Equation (7) above, and is summarized for various values of b and M in TABLE 2 below.

TABLE 2

Loss in Channel SNR Due to Initial Offset

| b | M | Loss in SNR |
|---|---|---|
| 4 | 16 | 0.56 dB |
| 5 | 32 | 0.28 dB |
| 6 | 64 | 0.14 dB |
| 7 | 128 | 0.068 dB |
| 8 | 256 | 0.034 dB |

As expected, the loss is negligible for large values of M. In applications in which small values of M are of interest, it may be appropriate to avoid introducing the initial offset in order to eliminate this loss.

The other approximation noted above relates to the use of constant peak energy $E_p$ rather than constant average symbol energy $E_s$ in the system comparisons. A system without the initial offset will be considered. For such a system, the average and peak energy values are given by Equations (3) and (4) above. In communication applications, systems with different numbers of levels are often compared at an equal average symbol energy $E_s$ or an equal average energy per information bit $E_b$. It will be shown that performing the above comparisons at equal peak energy does not differ significantly from average symbol energy or average energy per bit comparisons. Consider two systems, one with $M_1$ levels and a distance $d_1$ and the other with $M_2$ levels and a distance $d_2$, where $M_2 > M_1$. The difference in peak power when the two systems have the same average symbol energy will be calculated. Using Equation (3), equal average symbol energy implies:

$$\frac{d_1^2}{d_2^2} = \frac{(M_1-1)}{(M_2-1)} \cdot \frac{(2M_1-1)}{(2M_2-1)}. \quad (8)$$

The difference in peak power under these conditions, using Equations (4) and (8), is given by:

$$\frac{E_{p2}}{E_{p1}} = \frac{d_2^2}{d_1^2} \cdot \frac{(M_1-1)^2}{(M_1-1)^2} = \frac{(M_2-1)}{(M_1-1)} \cdot \frac{(M_1-1/2)}{(M_2-1/2)}. \quad (9)$$

The ratio in Equation (9) is greater than one. Thus, forcing the peak power of the two systems to be the same yields a distance loss in the system with the larger number of levels. TABLE 3 below provides a number of examples which indicate that this loss is negligible. It is therefore apparent that the approximations made in this description have negligible impact on the stated performance improvements.

TABLE 3

Loss in SNR Due to Comparisons in Constant Peak Energy $E_p$ Versus Constant Average Symbol Energy $E_s$

| $M_1$ | $M_2$ | Loss in SNR |
|---|---|---|
| 32 | 64 | 0.035 dB |
| 32 | 256 | 0.061 dB |
| 64 | 256 | 0.025 dB |

The analog storage techniques of the present invention may be implemented using more complex types of uncoded and coded modulation techniques, such as uncoded and coded modulation with multidimensional signal sets. In a multidimensional, uncoded system, a multidimensional signal set in m dimensions is used. Many such signal constellations have been designed for use in communication systems to minimize the error probability for a given average or peak energy constraint, so as to provide gains beyond the one-dimensional case. In an embodiment of the invention utilizing a multidimensional signal set, each dimension of a given signal is stored in a separate memory cell. More detailed examples will be provided below for two-dimensional signal sets. Using multidimensional uncoded signal sets makes it possible to store fractional bits per analog memory cell. For example, if a two-dimensional signal set with 32 signal points is used, five bits of information is stored in two cells yielding 2.5 bits/cell. Multidimensional signal sets generally allow better matching of memory cell storage capacity to bit error probability than one-dimensional signal sets.

As previously noted, the above-described multiple readout process may also be utilized in an analog storage system which uses a multidimensional signal set. For example, the m readout voltages from each of the m cells, together representing a signal point in an m-dimensional signal set or constellation, may each be summed or averaged over multiple readouts before making a decision about which signal point was read from the m cells. The multiple readout process in the uncoded and coded multidimensional cases will provide the same SNR gains for r uncorrelated readouts as shown in TABLE 1 above. In the coded multidimensional case, the sum or average of each cell readout is passed to the decoder for the coded modulation technique.

Figure 5:
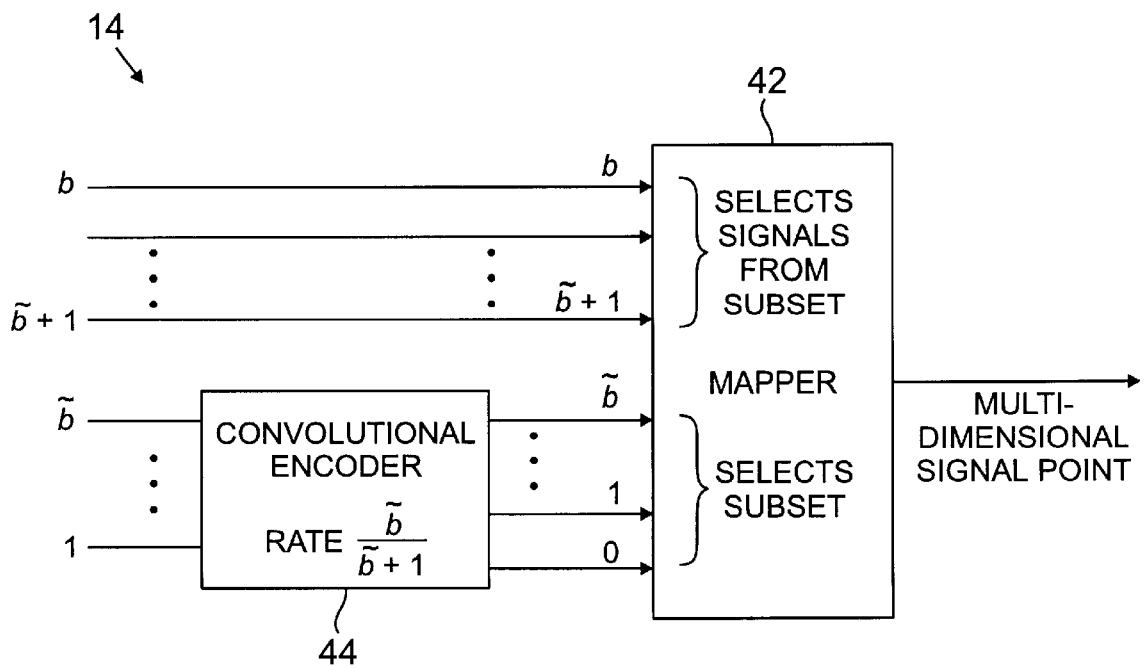
FIG. 5 shows the general structure of a coded multilevel modulation device for use in an embodiment of the invention which utilizes trellis coded modulation with multidimensional signal sets.

Coded modulation techniques for multidimensional signal sets are well known in the field of communication systems, and are described in the above-cited Ungerboeck, Viterbi et al. and Biglieri et al. references. For example, trellis coded modulation with multidimensional signal sets is used in high speed modems for telephone lines. FIG. 5 shows the general structure of a coded multilevel modulation device 14 for trellis coded modulation with multidimensional signal sets. The input symbol in this example is a word of b parallel information bits as in the simple pragmatic one-dimensional case illustrated in FIG. 2. The coded modulation device 14 of FIG. 5 may also include a serial/parallel converter such as converter 30 of FIG. 2, to generate the b parallel information bits from a serial bit stream. The coded modulation device 14 in FIG. 5 includes a mapper 42 and a convolutional encoder 44. The first $\tilde{b}$ bits of the set of b parallel bits are supplied to the encoder 44, which has a rate of $\tilde{b}/(\tilde{b}+1)$. A total of b+1 bits are therefore applied to the mapper 42. The mapping in the coded modulation device 14 of FIG. 5 is based on set partitioning. As shown in FIG. 5, the $\tilde{b}+1$ bits from the encoder 44 are used to select a particular subset of signals in an m-dimensional signal set. The remaining bits applied to the mapper 42 are used to select a particular signal from the selected subset. Each of the m dimensions of the selected signal may then be stored in a separate analog memory cell. The mapping rules and corresponding convolutional codes are described in greater detail in, for example, the above-cited Ungerboeck and Biglieri et al. references. In the simple pragmatic one-dimensional case illustrated in conjunction with FIG. 2, the convolutional encoder implements a standard rate 1/2 convolutional code, and the mapper is as shown in FIG. 4.

Another embodiment of the invention, involving coded modulation with two-dimensional signal sets, will now be described in greater detail. As mentioned previously, although the embodiment described in conjunction with FIGS. 2, 3B, 3C and 4 above utilized a simple one-dimensional pragmatic code, more efficient storage systems can be obtained by using the above-noted noted multidimensional modulation techniques, including trellis coded schemes with multidimensional signal sets. The extension of the storage techniques of the present invention to multidimensional modulation techniques will be illustrated using an exemplary two-dimensional AM technique, also referred to as quadrature amplitude modulation (QAM). Such a technique utilizes two memory cells to store two different amplitude levels corresponding to the two dimensions. Both dimensions will be assumed to be limited to the range 0 to V volts, with a fixed peak power limit in both dimensions as in the previously-described one-dimensional embodiment.

Figure 6:
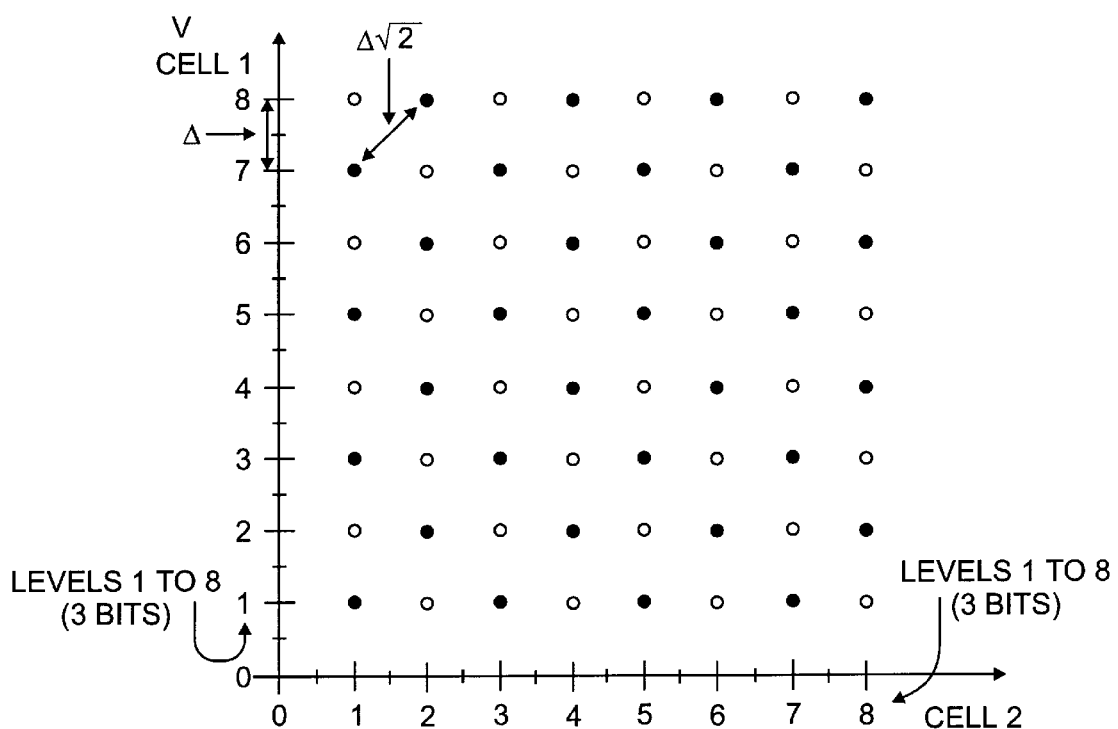
FIG. 6 shows 64 QAM and 32 AMPM two-dimensional signal sets suitable for use in embodiments of the invention based on coded modulation with two-dimensional signal sets.

FIG. 6 shows an exemplary two-dimensional 64 QAM signal set which may be used to implement an analog storage system in which three bits are stored in each of two memory cells. The levels stored in the first cell are indicated on the vertical axis in FIG. 6, while the levels stored in the second cell are indicated on the horizontal axis. By dividing the distance between signals in half along both axes, thereby doubling the number of levels on each axis, a 256 QAM signal set can be obtained, suitable for implementing a storage system with 4 bits per cell and 8 bits per pair of cells. As noted above, it is also permissible to store fractional numbers of bits per cell. For example, if the signals corresponding to unshaded circles in the 64 QAM signal set of FIG. 6 are eliminated, a so-called 32 AMPM signal set is obtained. This signal set may be used to implement a storage system which stores 5 bits per pair of cells, and thus 2.5 bits per cell. In the 32 AMPM case, in which the stored levels correspond to the shaded circles in FIG. 6, the error probability performance improves by 3 dB relative to the 64 QAM case, since the minimum Euclidean distance is improved by a factor of the square root of 2, as shown in FIG. 6. This multidimensional approach to implementing analog storage systems can be generalized to 256 QAM, 128 AMPM, and so on, by using more levels per cell. The use of two-dimensional signal sets, the uncoded error probability curves are now 3 dB apart for different numbers of bits per cell. In the previously-described one-dimensional case, the uncoded error probability curves were 6 dB apart for different numbers of bits per cell. The same general relationships have been found to hold true for the coded cases.

The trellis coded modulation techniques of the above-cited G. Ungerboeck references may be used in conjunction with the previously-described QAM and AMPM signal sets to provide in the two-dimensional case substantially the same relative results for high SNR values that were found for the one-dimensional case. However, an extra bit per cell can be stored at an equal error probability for high SNR values in the two-dimensional case with trellis coded modulation. The increase in the number of signal points in the case of trellis coded modulation is by a factor of 8, as indicated in the G. Ungerboeck references. The gain in SNR is 3 dB, as compared to 6 dB in the one-dimensional case. This feature could be useful in applications in which it is desirable to provide unequal error protection for certain data sources, as described in J. Hagenauer et al., "The Performance of Rate Compatible Punctured Convolutional Codes for Digital Mobile Radio," IEEE Transactions on Communications, Vol. 38, No. 7, pp. 966–980, July 1990, and R. V. Cox et al., "Sub-band Speech Coding and Matched Convolutional Channel Coding for Mobile Radio Channels," IEEE Transactions on Acoustics, Speech and Signal Processing, Vol. 39, No. 8, pp. 1717–1731, August 1991, both of which are incorporated by reference herein.

Increasing the number of signal points by a factor of two in the two-dimensional case provides the same storage capacity in both the coded and uncoded versions, but the coded version exhibits an improvement in error probability of as much as 6 dB at high SNR values for codes with up to about 256 states. Increasing the number of signal points by a factor of four in the two-dimensional case increases the storage capability at high SNR values by about 1 bit per 2 cells, or 1/2 bit per cell, even for a relatively simple code. Using a more complex modulation code, such as a code with 256 point signal set, at high SNR values an error probability improvement of about 3 dB is obtained in addition to the storage capacity improvement of 1 bit per 2 cells. The selection of number of code states generally involves a tradeoff with computational complexity.

In general, the code rate R in embodiments of the invention which utilize two-dimensional signal sets may be given by m/m+1, where the signal set includes $2^{m+1}$ signal points.

TABLE 4 below illustrates the tradeoffs between code complexity, storage capacity and error probability for an uncoded 16 QAM signal set and various coded 32 AMPM, 64 QAM and 128 AMPM signal sets. TABLE 5 below illustrates the tradeoffs between code complexity, storage capacity and error probability for general two-dimensional coded modulation in which the number of information bits b is greater than four. In both TABLE 4 and TABLE 5, the approximate coding gain is specified in dB at high SNR values. Generalizations of the above-described one-dimension and two-dimension embodiments of the invention to coded modulation techniques with more than two dimensions is straightforward and will be readily apparent to those skilled in the art.

TABLE 4

Comparison of Specific Two-Dimensional Signal Sets

| Signal Set | Number of Signal Points | Number of Bits Per Cell | Number of Code States | Approximate Coding Gain |
|---|---|---|---|---|
| 16 QAM | 16 | 2 | uncoded | Reference, 0 dB |
| 32 AMPM | 32 | 2 | 4 | 3 |
| 32 AMPM | 32 | 2 | 256 | 6 |
| 64 QAM | 64 | 2.5 | 4 | 0 |
| 64 QAM | 64 | 2.5 | 256 | 3 |
| 128 AMPM | 128 | 3 | 4 | −3 |
| 128 AMPM | 128 | 3 | 256 | 0 |

TABLE 5

Comparison of General Two-Dimensional Signal Sets with b > 4

| Number of Signal Points | Number of Bits Per Cell | Number of Code States | Approximate Coding Gain |
|---|---|---|---|
| $2^b$ | b/2 | uncoded | Reference, 0 dB |
| $2^{b+1}$ | b/2 | 4 | 3 |
| $2^{b+1}$ | b/2 | 256 | 6 |
| $2^{b+2}$ | (b + 1)/2 | 4 | 0 |
| $2^{b+2}$ | (b + 1)/2 | 256 | 3 |
| $2^{b+3}$ | b/2 + 1 | 4 | −3 |
| $2^{b+3}$ | b/2 + 1 | 256 | 0 |

An issue relating to the readout or playback of stored data in a processing system such as system 10 of FIG. 1 will now be addressed. In system 10 and many other practical applications, source bits may be encoded on a frame-by-frame basis. For example, an encoded voice message generated in the system 10 may be divided into a number of 20 msec frames. During readout of a voice data message encoded and stored in accordance with the above-described coded modulation techniques, the Viterbi decoder can generally start the decoding process with any frame. Thus, if the source bits are encoded on a frame-by-frame basis, the Viterbi decoder can decode each frame independently. However, in order for the last few bits of each frame to be decoded properly, a known sequence of "tail" bits may have to be inserted at the end of each frame in order to force the convolutional encoder to a known state. These inserted tail bits may reduce the number of actual coded speech bits that can be stored in the frame. In order to reduce the overhead associated with the use of tail bits to re-start the encoder on a frame-by-frame basis, the encoder may be configured to encode the entire message on a continuous basis. However, if the decoder then starts decoding with a frame in the middle of a message, the encoder starting state of that frame is unknown at the decoder. The Viterbi decoder may then take a few frames before it is able to obtain a good estimate of the starting state of the encoder and therefore produce reliable decoded bits. Thus, if the desired readout is from frame n, the Viterbi decoder can start decoding from an earlier frame, such as frame n−3, assuming that the decoder needs to decode 3 frames of data before a good estimate of the encoder starting state can be obtained. In this manner, reliable data can be decoded from frame n onwards.

Figure 7:
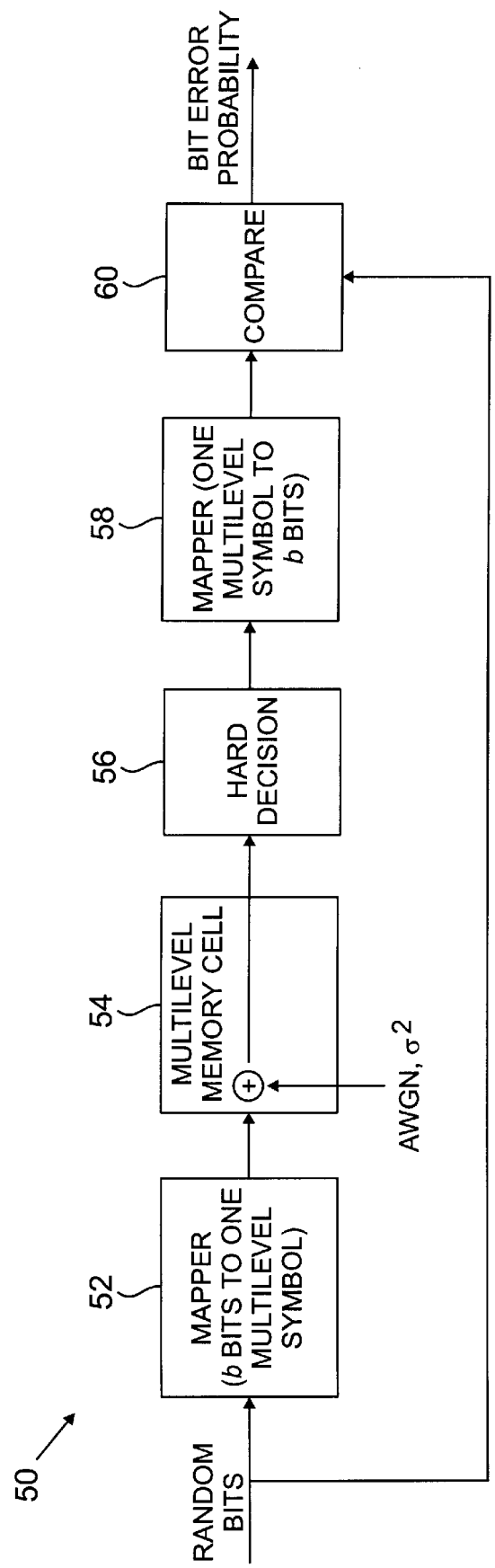
FIG. 7 shows a simulation model used to simulate the performance of a conventional uncoded analog memory cell.

A number of system simulations were performed to demonstrate the above-described storage capacity and error probability performance advantages of the invention. FIG. 7 shows a simulation model 50 used for analyzing the performance of various analog storage systems. The model 50 was initially used to simulate Case A, which is the conventional uncoded case corresponding to the example illustrated in FIG. 3A. In the simulation model 50, random bits are generated and groups of b bits are applied to a mapper 52 to form a symbol that is to be stored in an analog memory cell 54. For example, if b=3, the mapper 52 uses three random bits to form a value between 0 and 7 for storage in the analog memory cell 54. The memory cell 54 is modeled as an AWGN chapel. That is, each stored symbol is corrupted by an AWGN component $\sigma^2$ such that the readout value at the output of the analog memory cell may take on any value between 0 and 7 in this example, depending on the effect of the noise. A hard decision element 56 determines which of the eight possible integer values is closest to a given corrupted readout, and a mapper 58 maps this value back to b=3 bits. These b bits are compared with the b original random bits supplied to the mapper 52, and the bit error probability is computed. Simulations of more than one million bits were performed for different values of b and SNR.

Figure 8:
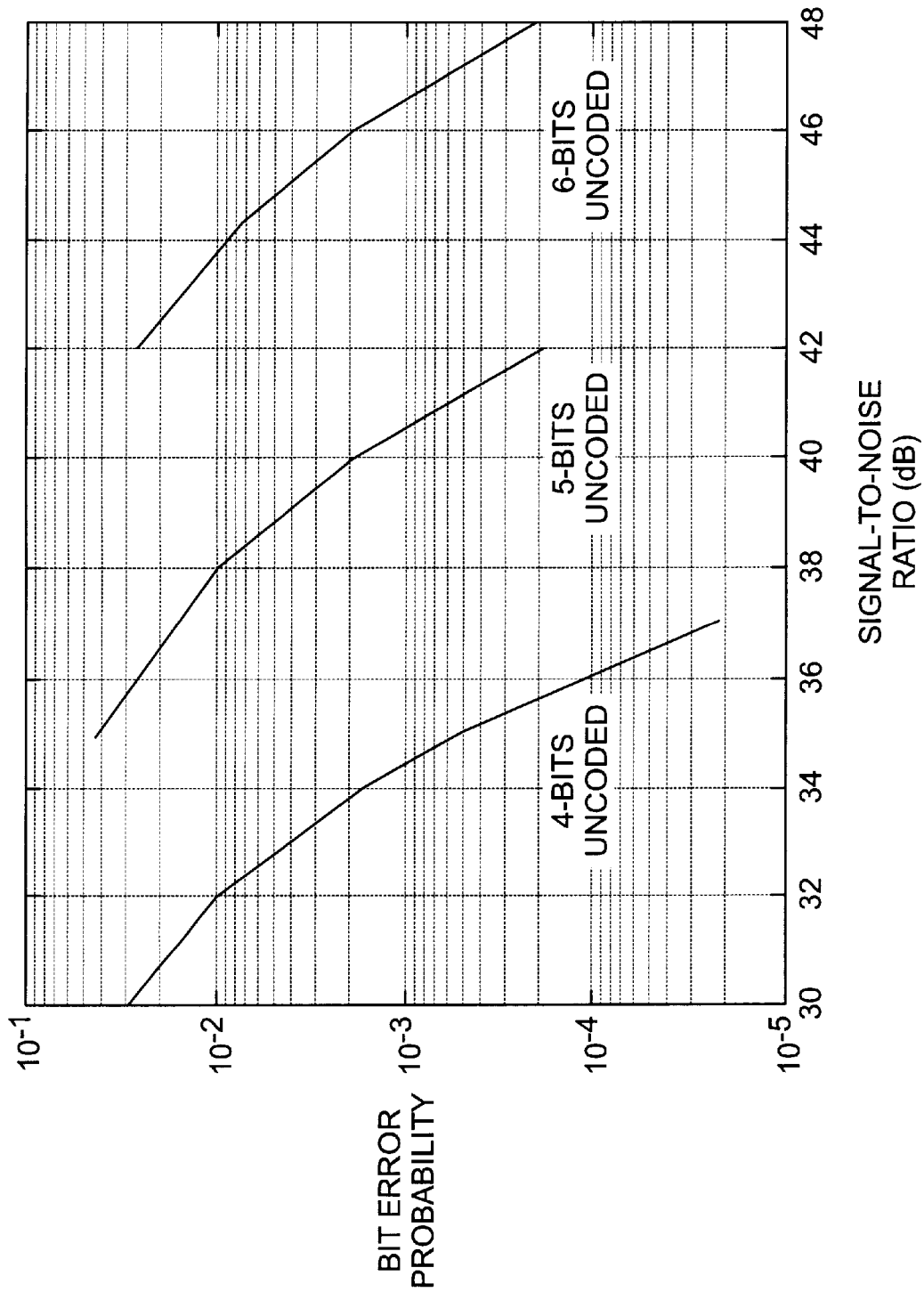
FIG. 8 shows the bit error rate performance of a conventional uncoded analog memory cell as measured using the simulation model of FIG. 7.

FIG. 8 shows the results of the simulations for the uncoded Case A using values of b=4, 5 and 6. The results are shown in the form of bit error probability curves as a function of SNR in dB. These simulations assume that the peak voltage level is the same for all values of b. As was noted in the previous analysis of the uncoded Case A, increasing the number of bits b by one decreases the distance between adjacent levels, and shifts the bit error probability curve to the right by 6 dB, indicating that a 6 dB higher SNR is required to provide the same bit error probability. These simulation results can also be verified using Equations (1) and (5) above.

A model similar to that of FIG. 7 was used to simulate the performance of the coded modulation storage technique of Case C, which corresponds to the example of FIG. 3C. Random bits were arranged in groups of b bits and applied to a channel encoder implementing the encoding process of the coded multilevel modulation device 14 of FIG. 2. The input bits were thus encoded such that for every group of b bits, b+1 bits were generated at the output of the encoder. Each group of b+1 bits was then mapped using a mapper such as that shown in FIG. 2 into one of $2^{b+1}$ multilevel AM symbols for storage in the analog memory cell 54. A given stored symbol was subject to AWGN upon readout. A noisy multilevel AM symbol read from the memory cell 54 was then decoded in a Viterbi decoder such as decoder 24 of FIG. 1. Soft decisions were used in the Viterbi decoder. The decoded bit stream at the Output of the Viterbi decoder was compared with the original random bit sequence in order to compute the bit error probability. In these simulations, the interleaving and multiple read-and-sum operations shown in FIG. 1 were not used because it was assumed that there was no noise correlation between adjacent memory cells and also that the memory readout mechanism was corrupted only by AWGN.

Figure 9:
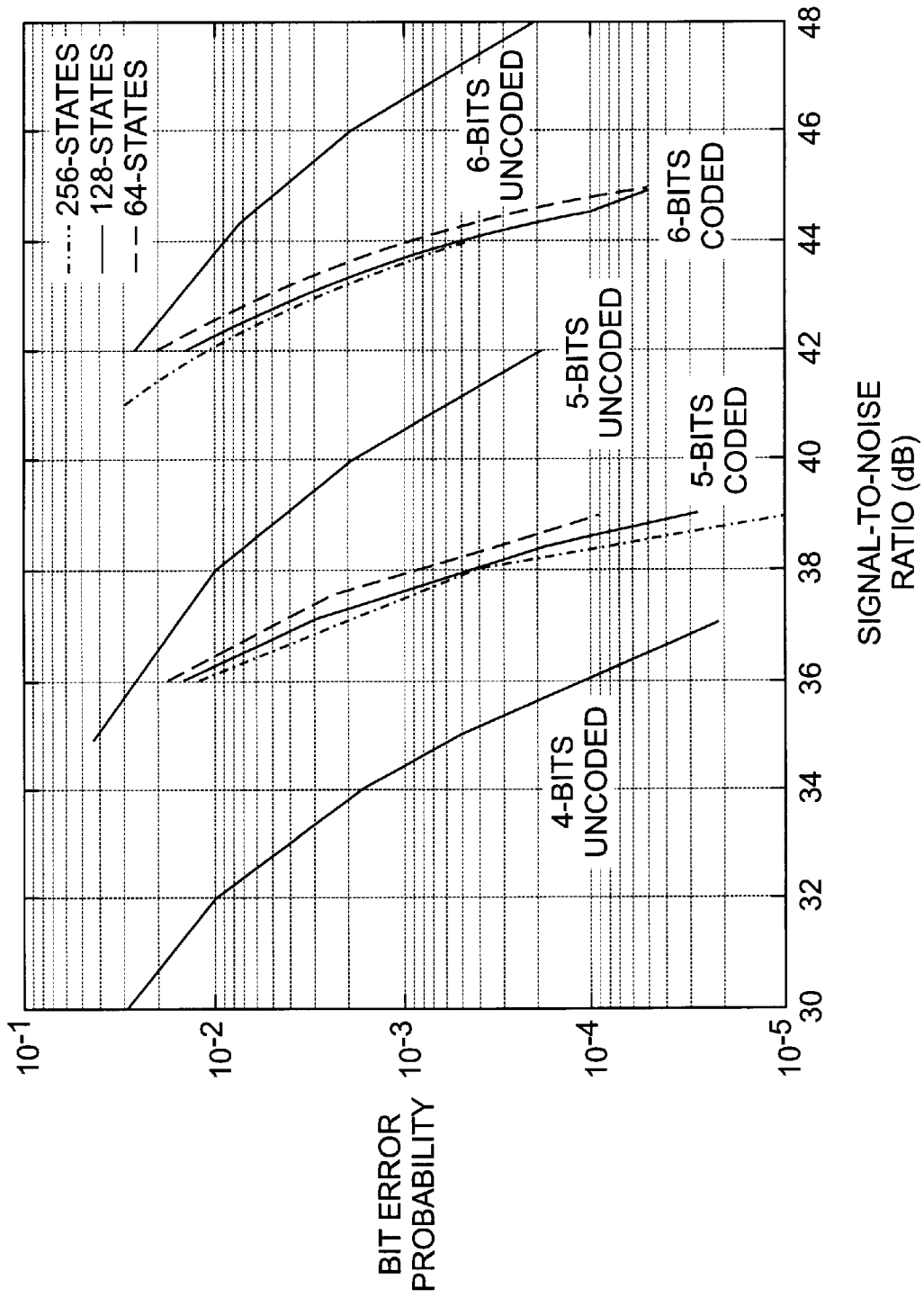
FIG. 9 compares the performance of conventional uncoded analog storage with various types of coded analog storage in accordance with the invention.

FIG. 9 shows the results of the simulations of coded Case C using values of b=5 and 6. The results are again shown in the form of bit error probability curves as a function of SNR in dB. These simulations also assume that the peak voltage level is the same for all values of b. For each value of b, the performance of three different convolutional codes was examined: a rate 1/2 64-state convolutional code with generator polynomial (171,133); a rate 1/2 128-state convolutional code with generator polynomial (371,247); and a rate 1/2 256-state convolutional code with generator polynomial (752,561). These and other suitable codes are described in greater detail in, for example, G. C. Clark, Jr. and J. B. Cain, "Error Correcting Codes for Digital Communications," Plenum Press, 1981. As described previously, a code with a free distance of at least $d_f=12$ may be used to obtain a gain of 6 dB at high SNR values. A rate 1/2 256-state convolutional code provides a free distance of at least $d_f=12$ and therefore may be used to obtain this 6 dB gain. The mapping of the coded bits to AM symbols was described in conjunction with FIGS. 3A, 3B and 3C above. FIG. 9 indicates that at high SNR values, the storage capacity of an analog memory device using coded modulation in accordance with the invention can be increased by one extra bit per cell, as compared to the uncoded Case A, without increasing the bit error probabilities. For example, if a given analog memory device can store 4 bits per cell without coding at an error probability $P_e=10^{-8}$, the use of coded modulation in accordance with the invention allows the analog memory device to store 5 bits per cell with the same bit error probability. TABLE 6 below shows a number of sample points from the bit error probability curves of FIG. 9.

TABLE 6

Sample Points from FIG. 9 Bit Error Probability Curves

| bits/cell | $P_e$ | $P_e$ | $P_e$ | $P_e$ | $P_e$ |
|---|---|---|---|---|---|
| 4 bits (uncoded) | $10^{-8}$ | $10^{-7}$ | $10^{-6}$ | $10^{-5}$ | $10^{-4}$ |
| 5 bits (uncoded) | $7 \times 10^{-4}$ | $10^{-3}$ | $5 \times 10^{-3}$ | $10^{-2}$ | $3 \times 10^{-2}$ |
| 5 bits (coded) | $10^{-8}$ | $3 \times 10^{-7}$ | $6 \times 10^{-5}$ | $10^{-3}$ | $10^{-2}$ |

It can also be seen from FIG. 9 or TABLE 6 that for a given fixed storage capacity, such as 5 bits per cell, the storage reliability of an analog memory device in terms of bit error probability can be increased by using the coded modulation techniques of the present invention. The amount of increased reliability is generally dependent on the operating SNR value and the specific type of code used. For example, the above-noted rate 1/2 256-state convolutional code provides a gain of 6 dB in SNR value at bit error probabilities on the order of $10^{-8}$.

The complexity of the coded modulation techniques of the present invention is generally dependent on the particular implementation platform used, with the Viterbi decoder introducing a substantial amount of the additional complexity. A rough estimate of the computations required to implement a given coded modulation technique can be generated, in terms of millions of instructions per second (MIPs). This value is dependent on the source bit rate. If the source bit rate is R kbps, the frame duration used by the source coder is t seconds (e.g., 20 msec for a voice coder), and the number of bits per symbol is b, then there are Rt/b symbols per frame. Thus, there are Rt/b iterations in the Viterbi decoder, as described in greater detail in H. Lou, "Implementing the Viterbi Algorithm: Fundamentals and real-time issues for processor designers," IEEE Signal Processing Magazine, Vol. 12, No. 5, September 1995, which is incorporated by reference herein. If N instructions are required to encode and decode one symbol, then RN/b instructions per second are required to process the coded modulation technique without having to buffer the input or output data. This estimate assumes that add, compare and shift operations each constitute one instruction, and does not count memory access instructions. The values of N for encoder/decoder pairs implementing the rate 1/2 64-state convolutional code, the rate 1/2 128-state convolutional code, and the rate 1/2 256-state convolutional code are about 3000, 5800 and 11570, respectively. As noted previously, the additional complexity attributable to the coded modulation technique is primarily in the Viterbi decoder. This is due to the fact that each encoder takes only about 30 instructions to implement. Given N, an estimate of the number of MIPs required to implement a given coded modulation technique can be generated. For example, in a voice data application such as that illustrated in FIG. 1, the voice coder may have a bit rate R of up to about 16 kbps, and the analog memory may be configured to store b=5 bits/cell. Such a system would require about RN/b=16 k×11570/5 or about 37 MIPs to implement the coded modulation technique, using the rate 1/2 256-state convolutional code.

The present invention provides improved storage in analog memory devices, resulting in higher storage capacity or alternatively more reliable storage in terms of bit error rate probability for a given fixed storage capacity. As described in greater detail above, this improvement may be achieved by using an increased number of storage levels in each cell and applying a combination of coding and amplitude modulation, generally referred to as coded modulation, to information bits using convolutional codes and Viterbi decoding. The multiple readout feature of the invention may be used independently of the coded modulation to improve readout reliability in both coded and uncoded applications, provided the noise in multiple readouts from the same cell is not strongly correlated. In embodiments in which the readout noise is correlated from cell to cell in sequential readouts, interleaving may be used to further improve performance.

Although the invention is illustrated herein using exemplary one-dimensional and two dimensional signal sets, having the techniques are readily applicable to signal sets more than two dimensions. In addition, the invention may make use of unequal error protection techniques, such as those described in greater detail in C-E. W. Sundberg et al., "Logarithmic PCM Weighted QAM Transmission over Gaussian and Rayleigh Fading Channels," IEEE Proceedings, Vol. 134, Pt. F, No. 6, pp. 557–570, October 1987, which is incorporated by reference herein. An unequal error protection design may be simpler and more flexible to implement for two-dimensional signal sets. For example, an alternative embodiment of the invention may mix uncoded and coded bit streams, so as to provide a bit error rate profile in which certain bits are at a low bit error rate and others are at a higher bit error rate. This will permit matching of the error sensitivity profile for a particular source coder, as described in the above-cited Hagenauer et al. and Cox et al. references. Other unequal error protection techniques suitable for use with the present invention are described in A. R. Calderbank and N. Seshadri, "Multilevel Codes for Unequal Error Protection," IEEE Transactions on Information Theory, Vol. 39, No. 4, pp. 1234–1248, July 1993, and L-F. Wei, "Coded Modulation with Unequal Error Protection," IEEE Transactions on Communications, Vol. 41, No. 10, pp. 1439–1449, October 1993, both of which are incorporated by reference herein. The invention may also be implemented using nonuniform signal sets, as described in the above-cited Sundberg et al. reference, in combination with pragmatic codes. Other embodiments of the invention may mix two different coded techniques. For example, an embodiment may be implemented using a first coded modulation technique for a first half of the bits in a given source message, and a less sensitive second modulation technique for the other half of the bits. As noted above, a two-dimensional coded modulation technique can increase storage capacity by ½ bit per 3 dB increase in SNR. The mixing of two different coded modulation techniques could thus be used to provide a storage gain of ½ bit per cell with one technique, such that an average gain of ¼ bit per cell is provided for both portions of a given source message.

The above-described embodiments of the invention are intended to be illustrative only. For example, alternative embodiments of the invention may utilize convolutional codes with rates other than the rate 1/2 used above. Moreover, block codes may be used in place of convolutional codes in other alternative embodiments. For example, block codes can be used in place of convolutional codes in the above-described pragmatic coded modulation, and block coded modulation can be used in place of trellis coded modulation. Exemplary block codes suitable for use with the invention are described in, for example, G. C. Clark, Jr. and J. B. Cain, "Error Correcting Codes for Digital Communications," Plenum Press, 1981. Block coded modulation is described in greater detail in, for example, H. Imai and S. Hirakawa, "A New Multilevel Coding Method Using Error-Correcting Codes," IEEE Transactions on Information Theory, Vol. IT-23, pp. 371–377, May 1977, which is incorporated by reference herein. Multilevel coding may also be used as an alternative to mapping by set partitioning. The invention may be implemented in systems using soft or hard decoding, as well as suboptimal decoding. Although illustrated above in a voice data application, the invention may be used to store any type of data in a wide variety of other applications. Furthermore, the invention is suitable for use with analog memory devices in which the output is unquantized or partially quantized, as well as devices in which the output is fully quantized and converted to a bit stream. These and numerous other alternative embodiments and implementations within the scope of the following claims will be apparent to those skilled in the art.

What is claimed is:

1. A method of storing information bits in an analog memory device, the device including a plurality of analog memory cells, the method comprising the steps of:

coding at least a portion of a given set of b of the information bits to generate a corresponding set of coded bits including more than b bits, such that the portion of the information bits subject to the coding is transformed into corresponding coded bits in the set of coded bits;

mapping the set of coded bits to one or more corresponding levels; and storing each of the one or more levels in one of the analog memory cells;

wherein the mapping step is configured to provide at least one of: (i) an increase in an effective storage capacity of at least a subset of the analog memory cells; and (ii) a decrease in a readout error probability of at least a subset of the analog memory cells; relative to an effective storage capacity and a readout error probability associated with storage of unmapped analog levels in the analog memory cells.

2. The method of claim 1 wherein the coding step includes applying a rate 1/2 convolutional code to i least significant bits, i=1, 2, . . . , of the set of b bits such that the corresponding set of coded bits includes b+i bits.

3. The method of claim 2 wherein the mapping step includes mapping the set of b+i coded bits to one of $2^{b+i}$ distinct amplitude levels.

4. The method of claim 1 wherein the mapping step includes mapping the set of coded bits to one of a plurality of signal amplitude levels, wherein each of the plurality of signal amplitude levels corresponds to a signal in a one-dimensional signal set.

5. The method of claim 1 wherein the mapping step includes mapping the set of coded bits to a signal in an m-dimensional signal set, such that each of m levels are used to represent a corresponding one of the dimensions of the signal.

6. The method of claim 5 wherein the storing step includes storing each of the m levels in a separate one of the analog memory cells.

7. The method of claim 1 further including the step of interleaving mapped levels for different sets of coded bits prior to storing the levels in corresponding cells of the memory device.

8. The method of claim 1 wherein the coding and mapping steps further include coding and mapping a first set of b bits using a first type of coded modulation, and coding and mapping a second set of b bits using a second type of coded modulation different than the first type of coded modulation.

9. The method of claim 1 further including the step of generating a single readout value using results of multiple readouts of the level stored in a given one of the analog memory cells.

10. The method of claim 1 further including the step of converting a readout of the stored levels from the memory cells to corresponding sets of bits using a Viterbi decoder.

11. The method of claim 10 wherein the information bits are divided into frames, and the method includes the step of starting a decoding process in the Viterbi decoder at a prior frame in order to provide a reliable estimate of encoder state for decoding a subsequent frame.

12. An analog memory device for storing a plurality of information bits, comprising:

a plurality of analog memory cells;

a coder having an input connected to receive the information bits, the coder coding at least a portion of a given set of b of the information bits to generate a corresponding set of coded bits including more than b bits, such that the portion of the information bits subject to the coding is transformed into corresponding coded bits in the set of coded bits; and a mapper having an input coupled to an output of the coder and receiving the set of coded bits, wherein the mapper is operative to map the set of coded bits to one or more corresponding levels, such that each of the one or more levels can be stored in one of the plurality of analog memory cells;

wherein the mapper is configured to provide at least one of: (i) an increase in an effective storage capacity of at least a subset of the analog memory cells; and (ii) a decrease in a readout error probability of at least a subset of the analog memory cells; relative to an effective storage capacity and a readout error probability associated with storage of unmapped analog levels in the analog memory cells.

13. The memory device of claim 12 wherein the coder is operative to apply a rate 1/2 convolutional code to i least significant bits of the set of b bits such that the corresponding set of coded bits includes b+i bits.

14. The memory device of claim 13 wherein the mapper is operative to map the set of b+i coded bits to one of $2^{b+i}$ distinct amplitude levels.

15. The memory device of claim 12 wherein the mapper is operative to map the set of coded bits to one of a plurality of signal amplitude levels, wherein each of the plurality of signal amplitude levels corresponds to a signal in a one-dimensional signal set.

16. The memory device of claim 12 wherein the mapper is operative to map the set of coded bits to a signal in an m-dimensional signal set, such that each of m levels are used to represent a corresponding one of the dimensions of the signal.

17. The memory device of claim 16 wherein each of the m levels are stored in a separate one of the analog memory cells.

18. The memory device of claim 12 further including an interleaver having an input connected to receive the mapped levels for different sets of coded bits from the mapper, wherein the interleaver is operative to interleave the mapped levels before the levels are stored in the cells.

19. The memory device of claim 12 wherein the coder and mapper are configured so as to provide coding and mapping of a first set of b bits using a first type of coded modulation, and coding and mapping of a second set of b bits using a second type of coded modulation different than the first type of coded modulation.

20. The memory device of claim 12 further including a readout unit having an input coupled to an output of at least one of the memory cells, wherein the readout unit is operative to generate a single readout value using results of multiple readouts of a stored level from a given one of the analog memory cells.

21. The memory device of claim 12 further including a Viterbi decoder for converting a readout of the stored levels from the memory cells to corresponding sets of bits.

22. The memory device of claim 21 wherein the information bits are divided into frames, and a reliable estimate of encoder state for a given frame is obtained by starting a decoding process in the Viterbi decoder at a prior frame.

23. A method of storing information bits in an analog memory device, the device including a plurality of analog memory cells, the method comprising the steps of:

mapping a given set of the information bits to a particular signal in an m-dimensional signal set, the signal including m dimensions; and storing each of the m dimensions of the signal as a level in a separate one of the analog memory cells.

24. The method of claim 23 wherein the mapping step is part of a coded modulation technique for converting a sequence of symbols, each symbol corresponding to a set of information bits, to a sequence of signals from the m-dimensional signal set in accordance with predetermined conversion rules.

25. The method of claim 24 wherein the coded modulation technique maps a sequence of b-bit symbols to a sequence of signals in the m-dimensional signal set, by (i) encoding the first $\tilde{b}$ bits of a set of b parallel bits of a given symbol at a rate of $\tilde{b}/(\tilde{b}+1)$ to generate a total of b+1 bits, (ii) using $\tilde{b}+1$ bits from the encoder to select a particular subset of signals in the m-dimensional signal set, and (iii) using the remainder of the b+1 bits to select a particular signal from the selected subset.

26. The method of claim 23 further including the step of interleaving mapped levels for different sets of bits prior to storing the levels in corresponding cells of the memory device.

27. The method of claim 23 wherein the mapping step further includes mapping a first set of bits using a first type of coded modulation, and mapping a second set of bits using a second type of coded modulation different than the first type of coded modulation.

28. The method of claim 23 further including the step of generating a single readout value using results of multiple readouts of the level stored in a given one of the analog memory cells.

29. An analog memory device for storing a plurality of information bits, comprising:

a plurality of analog memory cells; and a mapper operative to map a given set of the information bits to a particular signal in an m-dimensional signal set, the signal including m-dimensions, wherein each of the m dimensions of the signal is stored as a level in a separate one of the analog memory cells.

30. The memory device of claim 29 wherein the mapper is part of a coded modulation device which implements a coded modulation technique for converting a sequence of symbols, each symbol corresponding to a set of information bits, to a sequence of signals from the m-dimensional signal set in accordance with predetermined conversion rules.

31. The memory device of claim 30 wherein the coded modulation device maps a sequence of b-bit symbols to a sequence of signals in the m-dimenisional signal set, by (i) encoding the first $\tilde{b}$ bits of a set of b parallel bits of a given symbol at a rate of $\tilde{b}/(\tilde{b}+1)$ to generate a total of b+1 bits, (ii) using $\tilde{b}+1$ bits from the encoder to select a particular subset of signals in the m-dimensional signal set, and (iii) using the remainder of the b+1 bits to select a particular signal from the selected subset.

32. The memory device of claim 29 further including an interleaver having an input connected to receive the mapped levels for different sets of coded bits from the mapper, wherein the interleaver is operative to interleave the mapped levels before the levels are stored in the cells.

33. The memory device of claim 29 wherein the mapper is configured so as to provide mapping of a first set of bits using a first type of coded modulation, and mapping of a second set of bits using a second type of coded modulation different than the first type of coded modulation.

34. The memory device of claim 29 further including a readout unit having an input coupled to an output of at least one of the memory cells, wherein the readout unit is operative to generate a single readout value using results of multiple readouts of a stored level from a given one of the analog memory cells.

35. A method of storing information bits in an analog memory device, the device including a plurality of analog memory cells, the method comprising the steps of:

processing a sequence of symbols, each of the symbols corresponding to a set of the information bits, to generate a sequence of signals selected from an m-dimensional signal set, such that each of the signals includes in dimensions; and storing each of the m dimensions of a given signal in the sequence of signals as a level in a separate one of the analog memory cells.

36. The method of claim 35 wherein the processing step maps a sequence of b-bit symbols to a sequence of signals in the m-dimensional signal set, by (i) encoding the first $\tilde{b}$ bits of a set of b parallel bits of a given symbol at a rate of $\tilde{b}/(\tilde{b}+1)$ to generate a total of b+1 bits, (ii) using $\tilde{b}+1$ bits from the encoder to select a particular subset of signals in the m-dimensional signal set, and (iii) using the remainder of the b+1 bits to select a particular signal from the selected subset.

37. An analog memory device for storing a plurality of information bits, comprising:

a plurality of analog memory cells; and a coded modulation device for processing a sequence of symbols, each of the symbols corresponding to a set of the information bits, to generate a sequence of signals selected from an m-dimensional signal set, such that each of the signals includes m dimensions, and each of the m dimensions of a given signal in the sequence of signals is stored as a level in a separate one of the analog memory cells.

38. The memory device of claim 37 wherein the coded modulation device maps a sequence of b-bit symbols to a sequence of signals in the m-dimensional signal set, by (i) encoding the first $\bar{b}$ bits of a set of b parallel bits of a given symbol at a rate of $\bar{b}/(\bar{b}+1)$ to generate a total of b+1 bits, (ii) using $\bar{b}+1$ bits from the encoder to select a particular subset of signals in the m-dimensional signal set, and (iii) using the remainder of the b+1 bits to select a particular signal from the selected subset.

39. A method of storing information bits in an analog memory device, the device including a plurality of analog memory cells, the method comprising the steps of:

coding at least a portion of a given set of b of the information bits to generate a corresponding set of coded bits including more than b bits, such that the portion of the information bits subject to the coding is transformed into corresponding coded bits in the set of coded bits;

mapping a given set of the coded bits to one or more levels;

storing each of the one or more levels in one of the cells of the analog memory device; and generating a single readout value using results of multiple readouts of a stored level from a given one of the cells wherein the mapping step is configured to provide at least one of: (i) an increase in an effective storage capacity of at least a subset of the analog memory cells; and (ii) a decrease in a readout error probability of at least a subset of the analog memory cells; relative to an effective storage capacity and a readout error probability associated with storage of unmapped analog levels in the analog memory cells.

40. The method of claim 39 wherein the generating step includes summing the multiple readouts from the given cell to generate the single readout value.

41. The method of claim 39 wherein the generating step includes averaging the multiple readouts from the given cell to generate the single readout value.

42. An analog memory device for storing a plurality of information bits, comprising:

a plurality of analog memory cells;

a coder operative to code at least a portion of a given set of b of the information bits to generate a corresponding set of coded bits including more than b bits, such that the portion of the information bits subject to the coding is transformed into corresponding coded bits in the set of coded bits;

a mapper operative to map a set of the coded bits to one or more levels, such that each of the one or more levels is stored in one of the plurality of cells; and a readout unit having an input coupled to an output of a given one of the memory cells, wherein the readout unit is operative to generate a single readout value using results of multiple readouts of a stored level from the given cell;

wherein the mapper is configured to provide at least one of: (i) an increase in an effective storage capacity of at least a subset of the analog memory cells; and (ii) a decrease in a readout error probability of at least a subset of the analog memory cells; relative to an effective storage capacity and a readout error probability associated with storage of unmapped analog levels in the analog memory cells.

43. The memory device of claim 42 wherein the readout unit is operative to sum the multiple readouts from the given cell to generate the single readout value.

44. The memory device of claim 42 wherein the readout unit is operative to average the multiple readouts from the given cell to generate the single readout value.

* * * * *